(12) United States Patent
Nanda et al.

(10) Patent No.: US 7,746,250 B2
(45) Date of Patent: Jun. 29, 2010

(54) MESSAGE ENCODING/DECODING USING TEMPLATED PARAMETERS

(75) Inventors: Arun K. Nanda, Sammamish, WA (US); John P. Shewchuk, Redmond, WA (US); Christopher G. Kaler, Sammamish, WA (US); Hervey O. Wilson, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 78 days.

(21) Appl. No.: 12/023,998

(22) Filed: Jan. 31, 2008

(65) Prior Publication Data

US 2009/0198761 A1    Aug. 6, 2009

(51) Int. Cl.
*H03M 7/30* (2006.01)
(52) U.S. Cl. .............................. 341/87; 341/50; 341/51
(58) Field of Classification Search ................ 341/50, 341/51, 87; 375/240.05, 240.08, 240.12
See application file for complete search history.

(56) References Cited

U.S. PATENT DOCUMENTS

| | | | | |
|---|---|---|---|---|
| 6,888,893 | B2 * | 5/2005 | Li et al. ................. | 375/240.25 |
| 7,292,160 | B1 | 11/2007 | Wang | |
| 2002/0099734 | A1 | 7/2002 | Yassin et al. | |
| 2003/0128759 | A1 * | 7/2003 | Prakash et al. ......... | 375/240.08 |
| 2003/0145115 | A1 | 7/2003 | Worger et al. | |
| 2004/0143791 | A1 | 7/2004 | Ito et al. | |
| 2004/0215830 | A1 | 10/2004 | Shenfield | |
| 2005/0135480 | A1 * | 6/2005 | Li et al. ................. | 375/240.12 |
| 2005/0228865 | A1 | 10/2005 | Hirsch | |
| 2006/0117307 | A1 | 6/2006 | Averbuch et al. | |
| 2006/0123047 | A1 | 6/2006 | Christensen et al. | |
| 2006/0123425 | A1 | 6/2006 | Ramarao et al. | |
| 2006/0212467 | A1 | 9/2006 | Murthy et al. | |
| 2007/0168464 | A1 | 7/2007 | Noonan et al. | |

FOREIGN PATENT DOCUMENTS

KR    20040002566    1/2004

OTHER PUBLICATIONS

Will Binary XML Solve XML Performance Woes? (3 pages) http://www.zapthink.com/report.html?id=ZAPFLASH-11162004.
Message Encoding (1 page) http://msdn2.microsoft.com/en-us/library/ms731802.aspx.
Soap Message Transmission Optimization Mechanism (16 pages) http://www.w3.org/TR/2004/WD-soap12-mtom-20040608/.
Deeply Embedded XML Communication—Towards an Interoperable and Seamless World (6 pages) http://research.microsoft.com/research/EmbeddedSystems/EWS/XML-emsoft05.pdf.
XML Encoding for SMS (Short Message Service) Messages (10 pages) http://xml.coverpages.org/xml-sms.html.

* cited by examiner

*Primary Examiner*—Jean B Jeanglaude
(74) *Attorney, Agent, or Firm*—Workman Nydegger

(57) ABSTRACT

Communication of a compressed message over a communication channel between message processors. The compressed message may be expressed in terms of an expressed or implicit template identification, and values of one or more parameters. Based on the template identification, the meaning of the one or more parameters may be understood, whereas the meaning of the parameter(s) may not be understood without a knowledge of the template. The template provides semantic context for the one or more parameters. The transmitting message processor may have compressed the message using the identified template. Alternatively or in addition, the receiving message processor may decompress the message using the identified template. The template itself need not be part of the compressed message as transmitted.

19 Claims, 7 Drawing Sheets

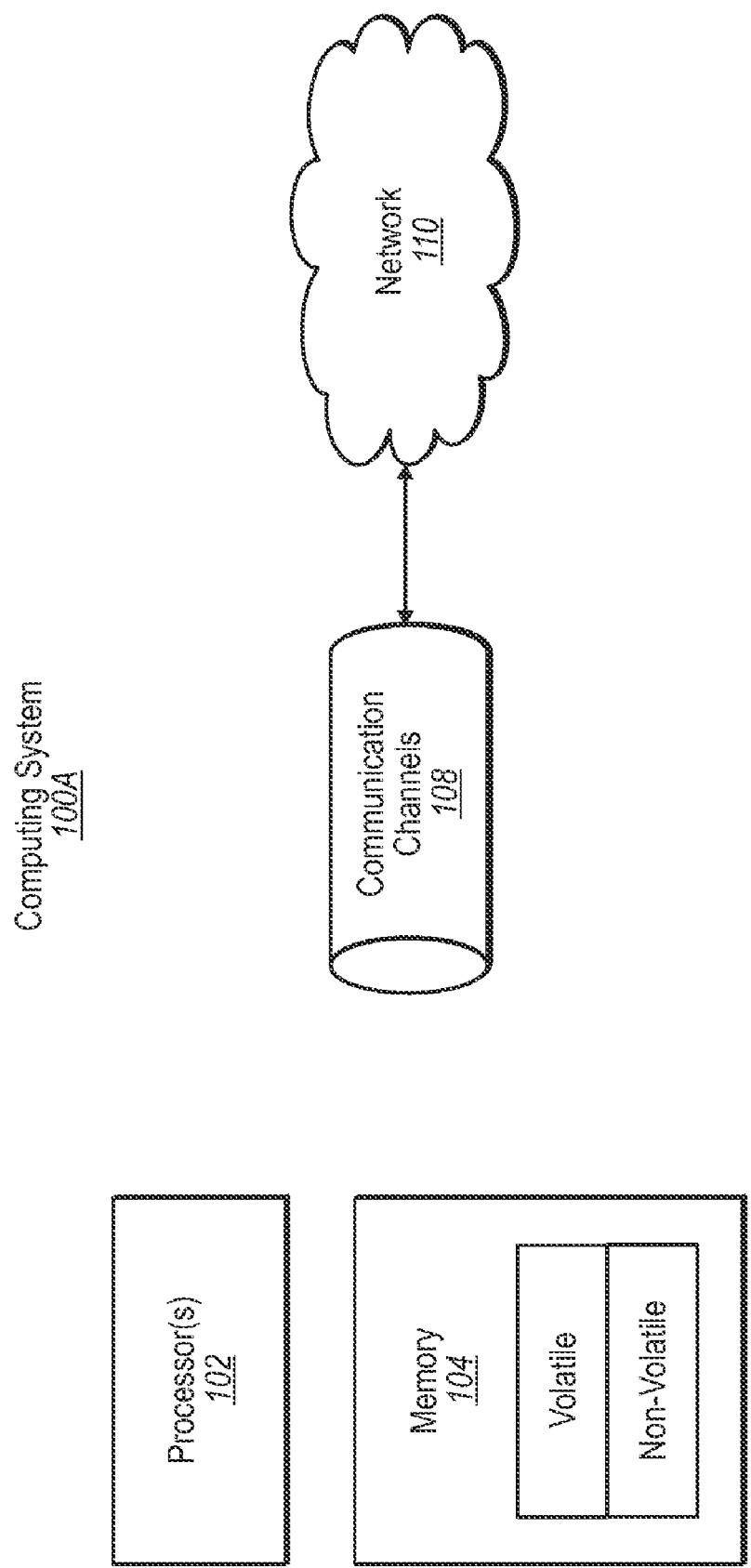

MESSAGE ENCODING/DECODING USING TEMPLATED PARAMETERS

BACKGROUND

Our modern connected world is facilitated by message processors communicating messages back and forth. A message processor may be quite complex such as a fully capable computing system or even a collection of computing systems. On the other hand, a message processor may be quite simple, and might even be just a simple state machine (e.g., an earpiece). Message processors may also have capabilities between these two extremes. Furthermore, the capabilities of channels between message processors are just as varied. The channel may be a fiberoptic bundle, having large bandwidths on the order of many terabits (10^12 bits) of information per second, or may be much slower such as, for example, an infrared or Bluetooth connection.

In order to reduce the amount of information transmitted between message processors over a particular channel, the information is often compressed. In a typically compression technology, a dictionary of symbols is constructed, where each symbol replaces a particular sequence of bits. Huffman encoding, Arithmetic coding, and LZW coding are examples of such a dictionary-based compression technology. However, such compression technologies perform compression based on knowledge at the bit-level, and do not use semantic knowledge of the data (i.e., the meaning of the data) to perform compression.

BRIEF SUMMARY

Embodiments described herein relate to the communication of a compressed message over a communication channel between message processors.

In one embodiment as viewed on the transmit side, the transmit message processor may express a message in compressed form in terms of a template identification (either explicitly or implicitly identified), and one or more parameters. Based on the template identification, the meaning of the one or more parameters may be understood, whereas the meaning of the parameter(s) may not be understood without a knowledge of the template. In one embodiment, the transmit message processor first accesses a pre-compressed message, identifies a template to use to compress that message, and identifies one or more parameters of the message that are not populated in the template. The transmit message processor may then formulate the compressed message by simply identifying the template (expressly or implicitly), and then including the specific values of the parameters. Alternatively, the transmit message processor simply operates on the parameter values with proper semantic understanding of the identified template.

In one embodiment on the receive side, the receive message processor may receive the compressed form of the message. The receive message processor may operate directly upon the compressed message, or may first act to decompress the message prior to acting upon the message. In either case, the template identification serves to provide contextual semantic understanding of the meaning of the parameters included in the compressed message. If the receive message processor decompresses the message, the identified template may be used as a structural foundation for the decompressed message, where the parameter values are used to populate portions of that decompressed message.

The principles described herein are not limited to any particular type of template. As one example, the template may be part of a static template set accessible and understood by both message processors. For instance, the static template set may be part of a standard, may be part of a distributed application that both message processors participate in, may be negotiated during a handshake process at the beginning of the communication, or set in some other manner. Alternatively or in addition, the template set may be dynamic, perhaps building upon a static template set and founded upon further communication between the message processors.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which:

FIG. 1A illustrates one example of a message processor in the form of a computing system;

DETAILED DESCRIPTION

In accordance with embodiments described herein, a message compression and decompression is described. The compressed message may be represented in terms of an explicit or implicit template identification, and values of one or more parameters. Based on the template identification, the meaning of the one or more parameters may be understood, whereas the meaning of the parameter(s) might not be understood without a knowledge of the template. The template provides semantic context for the one or more parameters. The transmitting message processor may have compressed the message using the identified template. Alternatively or in addition, the receiving message processor may decompress the message using the identified template. The template itself need not be part of the compressed message as transmitted.

First, some introductory discussion regarding message processors will be described with respect to FIGS. 1A and 1B. Then, various embodiments of compression and decompression using a semantic template will be described with respect to FIGS. 2A through 7. Finally, a method for dynamically altering the template set that may be used to compress or decompress will be described with respect to FIG. 8.

In this description and in the claims, a "message processor" is to be interpreted very broadly to include any device or computing system that is capable of processing a message. The "processing" of a message includes any one or more of accessing data from the message, providing data into the message, constructing the message, compressing the message, decompressing the message, and/or interpreting data in the message.

Figure 1B:
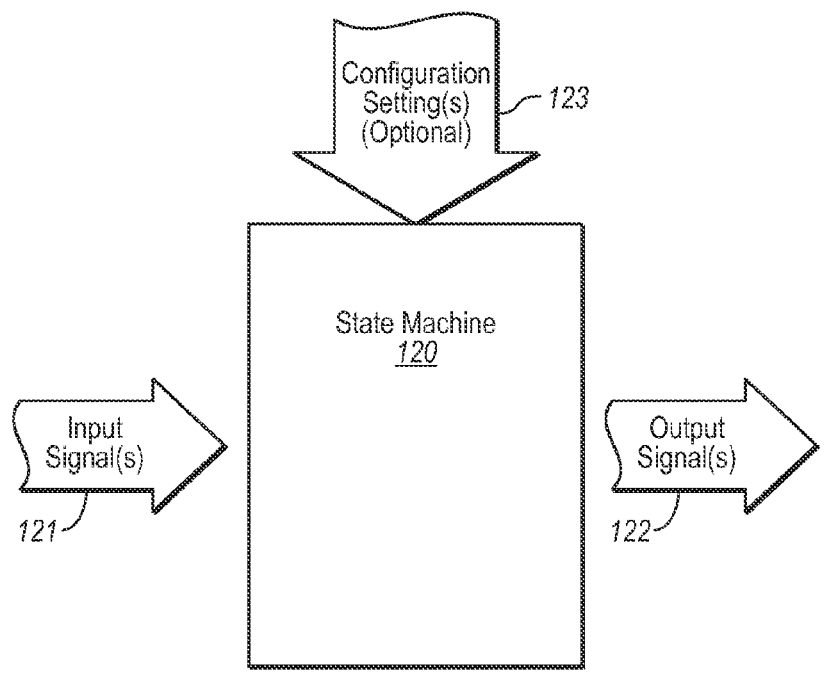
FIG. 1B illustrates another example of a message processor in the form of a state machine.

FIG. 1A illustrates one example of a message processor in the form of a computing system, which will now be described in some detail. Afterwards, another message processor will be described with respect to a state machine of FIG. 1B. That said, one of ordinary skill in the art will recognize that the term "message processor" will not be limited by the embodiments described in FIGS. 1A and 1B, and that FIGS. 1A and 1B are provided for purposes of illustrating examples only. There are literally an unlimited variety of possible implementations of a message processor. To illustrate and describe all of them would unnecessarily obfuscate the broader principles of the present invention.

Computing systems are now increasingly taking a wide variety of forms. Computing systems may, for example, be handheld devices, appliances, laptop computers, desktop computers, mainframes, distributed computing systems, or even devices that have not conventionally considered a computing system. In this description and in the claims, the term "computing system" is defined broadly as including any device or system (or combination thereof) that includes at least one processor, and a memory capable of having thereon computer-executable instructions that may be executed by the processor. The memory may take any form and may depend on the nature and form of the computing system. A computing system may be distributed over a network environment and may include multiple constituent computing systems. That said, a "message processor" is not even limited to use in a computing system at all.

FIG. 1A illustrates a message processor in the form of a computing system 100A. In its most basic configuration, a computing system 100 typically includes at least one processing unit 102 and memory 104. The memory 104 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well.

As used herein, the term "module" or "component" can refer to software objects or routines that execute on the computing system. The different components, modules, engines, and services described herein may be implemented as objects or processes that execute on the computing system (e.g., as separate threads). Software applications may have a number of constituent interrelated modules. In distributed applications, different modules of the application may be deployed on different physical machines.

In the description that follows, embodiments are described with reference to acts that are performed by one or more computing systems. If such acts are implemented in software, one or more processors of the associated computing system that performs the act direct the operation of the computing system in response to having executed computer-executable instructions. An example of such an operation involves the manipulation of data. The computer-executable instructions (and the manipulated data) may be stored in the memory 104 of the computing system 100A. For instance, if the computing system 100A is a message processor that compresses a message in the manner described herein, that compression (or decompression) might be accomplished using computer-executable instructions that direct the processor to cause the compression (or decompression) to occur.

Computing system 100A may also contain communication channels 108 that allow the computing system 100A to communicate with other message processors over, for example, network 110. Communication channels 108 are examples of communications media. Communications media typically embody computer-readable instructions, data structures, program modules, or other data in a modulated data signal such as a carrier wave or other transport mechanism and include any information-deliver media. By way of example, and not limitation, communications media include wired media, such as wired networks and direct-wired connections, and wireless media such as acoustic, radio, infrared, and other wireless media. The term computer-readable media as used herein includes both storage media and communications media.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FIG. 1B illustrates a message processor in the form of a state machine 120. A state machine 120 may be implemented entirely in hardware. The state machine receives input signal(s) 121, and deterministically generates output signal(s) 122.

Optionally, the deterministic function may depend on one or more optional configuration settings 123. In one embodiment, the state machine 120 may be implemented using logic gates and potentially other circuit components such as perhaps registers and clocks. When implemented as a message processor, the state machine 120 may perform the compression and/or decompression described herein. For compression, the input signal(s) 121 may represent the pre-compressed message, and the output signal(s) 122 may represent the compressed message. For decompression, the input signal(s) 121 may represent the compressed message, and the output signal(s) 122 may represent the decompressed message.

Figure 2A:
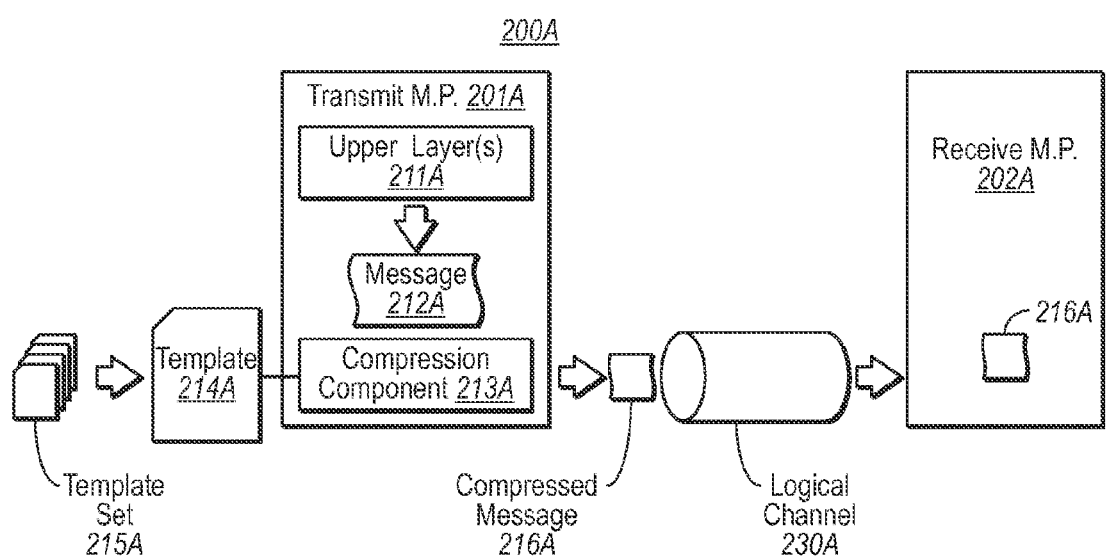
FIG. 2A illustrates a messaging environment in which the transmit message processor compresses a message for transmission, but the receive message processor operates directly on the compressed form of the message.
Figure 2B:
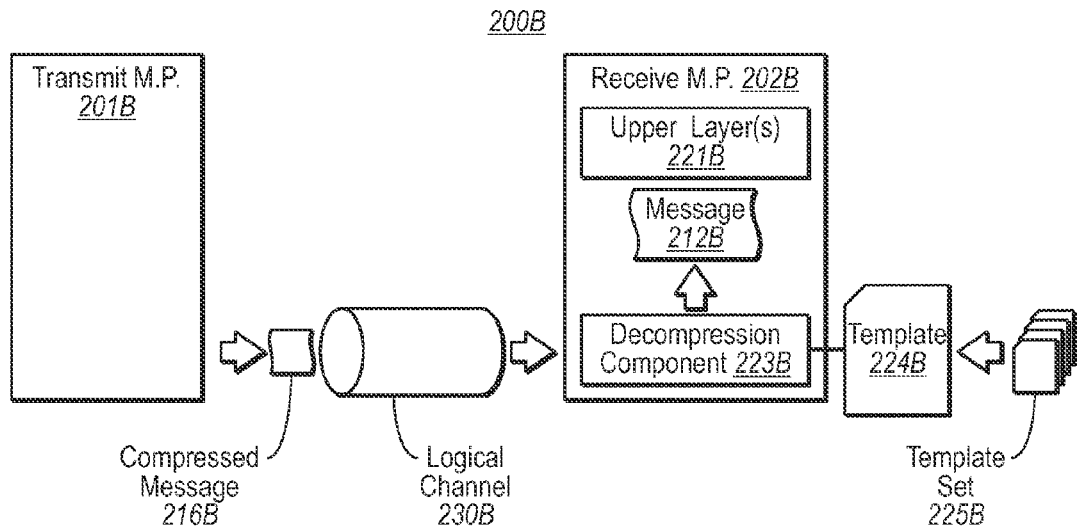
FIG. 2B illustrates a messaging environment in which the transmit message processor operates upon a compressed form of a message, but in which the receive message processor decompresses the message.
Figure 2C:
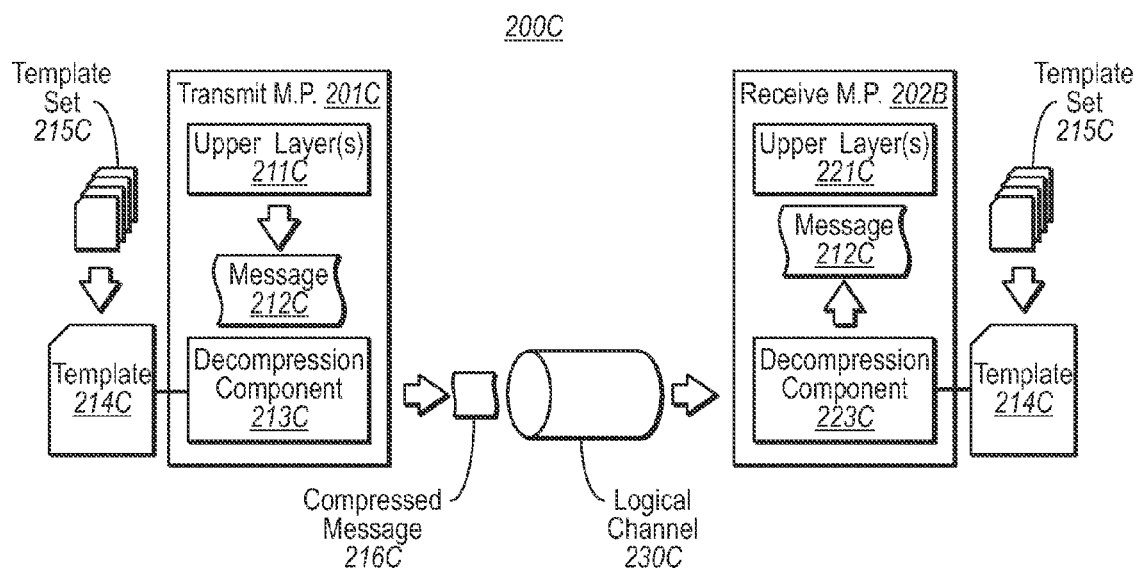
FIG. 2C illustrates a messaging environment in which the transmit message processor compresses a message for transmission, and in which the receive message processor decompresses the message.

Now that example message processors have been described, various embodiments for using message processors to compress and decompress messages using semantic templates for the message will now be described with respect to FIGS. 2A through 7. First, FIG. 2A through 2C illustrate various messaging environments 200A, 200B and 200C. In each case, the message environment includes a transmit message processor 201 (corresponding to transmit message processors 201A, 201B and 201C), and a receive message processor 202 (corresponding to receive message processors 202A, 202B and 202C). The transmit message processors 201 are called "transmit" message processors simply because in an example described herein, they transmit messages. The receive message processors 202 are called "receive" message processors simply because in the example described herein, they receive messages. However, typical message processors often transmit and receive messages. Accordingly, the term "transmit" and "receive" should not be interpreted as exclusively requiring that a message processor only transmit messages in the case of a transmit message processor or only receive messages in the case of a receive message processor.

FIG. 2A illustrates a message environment 200A in which the transmit message processor 201A compresses the message, but the receive message processor 202A operates directly on the compressed message. In particular, the transmit message processor includes an upper layer(s) 211A that provides a pre-compressed message 212A to a compression component 213A.

Messages may undergo various stages of compression and processing. A "pre-compressed" message means that the message has not yet undergone compression using the principles of the present invention. Some or all of the message might have undergone other types of compression using other compression technologies not described herein, and not within the scope of the present invention. However, the message is termed "pre-compressed" even in those cases, since message has not yet undergone compression as described herein. Furthermore, the term "component" when used with reference to a message processor may be a software component, a hardware component, or a combination.

The compression component 213A compresses the message using a template 214A. In particular, in one embodiment, the compression component 213A selects a template that matches the semantic context of the message itself. The template is then used to select one or more parameters from the message to transmit, rather than transmitting the entire message. In the case where there is more than one template, the template 214A is accessed from a template set 215A. The compression component 213A formulates a compressed message 216A for transmission to a receive message processor 202A in the form of the one or more parameters, and an identification (implicit or expressed) of the templates. Often, a compressed message is not transmitted directly from a compression component, but often undergoes other processing prior to physical transmission of the message. Accordingly, the message being "transmitted" should be viewed as a logical transmission over a logical channel 230A. The logical channel 230A may include a physical channel, but may also include lower level processing components on either or both of the transmit and receive message processors.

Once the receive message processor 202A accesses the compressed message 216A (or at least a derivative thereof) from the logical channel 230A, the receive message processor 202 operates directly upon the compressed message 216A without first decompressing the message 216A.

In contrast, FIG. 2B illustrates a messaging environment 200B in which the transmit message processor 201B operates directly upon the compressed message 216B. In this sense, the use of the term "compressed" to describe message 216B does not mean that the message was previously compressed from a larger message. Rather, the term "compressed" merely means that the message may be decompressed or expanded into a larger form using a semantic template. The transmit message processor 201B transmits the compressed message 216B into the logical channel 230B.

Upon receiving the compressed message 216B from the logical channel 230B, the receive message processor 202B decompresses the message 216B using a decompression component 223B. The decompression is accomplishes using a template 224B. The template 224B may be implicitly or expressly identified in the compressed message itself. In one embodiment, the decompression is accomplished by placing the one or more parameter values provided in the compressed message into an instance of the template identified in the compressed message to thereby populate the expanded message. If there are multiple templates, the template 224B is selected from a template set 225B. The decompression may be accomplished by using the template 224B. The decompressed or expanded message 222B is then provided to the upper layer(s) 221B for further processing.

FIG. 2C illustrates a messaging environment 200C in which the transmit message processor 201C compresses the message, and in which the receive message processor 202C decompresses the message. In particular, the transmit message processor 201C includes upper layer(s) 211C that provides a pre-compressed message 212C to a compression component 213C.

The compression component 213C compresses the message using a template 214C perhaps selected from a template set 215C. In one embodiment, the compression component 213C formulates a compressed message 216C for transmission to a receive message processor 202A in the form of an identification (implicit or expressed) of the template as well as one or more parameters. The compressed message 216C may then be transmitted on the logical channel 230C.

Upon receiving the compressed message 216C from the logical channel 230C, the receive message processor 202C decompresses the message 216C using a decompression component 223C. The decompression is accomplishes using a template 214C perhaps selected from a template set 215C. The template used to decompress may, but need not, be the same as the template used to compress. Furthermore, the receive message processor 202C may, but need not, have access to the same template set that the transmit message processor 201C has access to. The decompressed message 212C may then be provided to upper layer(s) 221C for further processing.

Accordingly, the embodiments described herein may be used to compress a message at the transmit side and/or decompress a message at the receive side. An example transmission process will now be described with respect to a specific example expanded message, template, and compressed message example.

Figure 3:
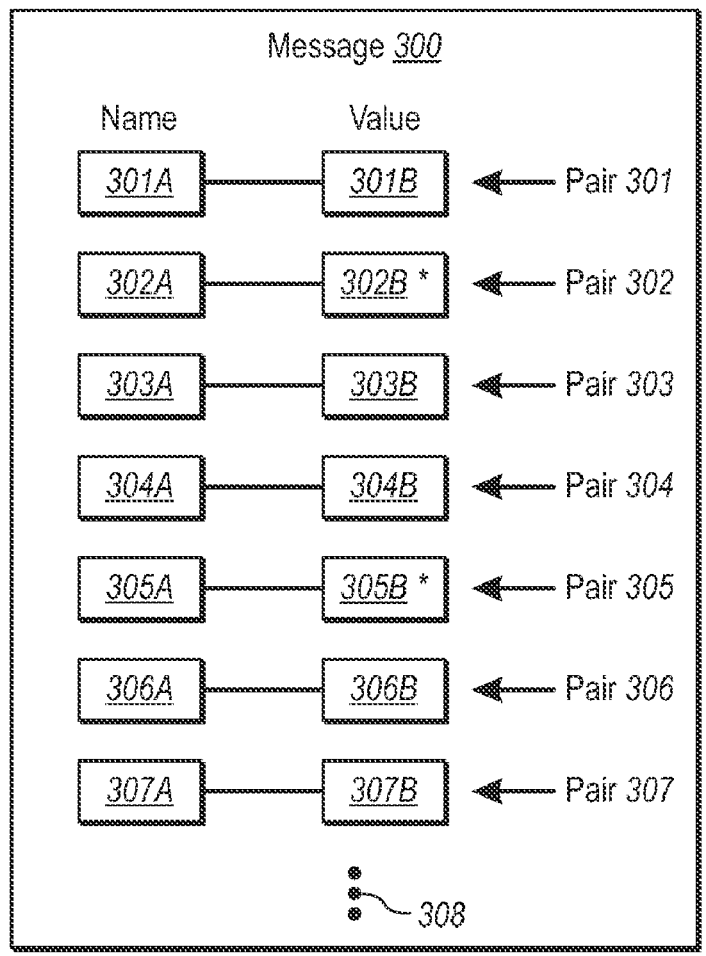
FIG. 3 illustrates a data structure of a message that may be represented by one or more parameters, and a template that expresses some semantic context of the message and semantic context for the one or more parameters within the message.

FIG. 3 schematically illustrates a data structure of an expanded message 300. Although not required, in the illustrated example, the message includes a number of parameter name-value pairs. Specifically, seven name value pairs 301 through 307 are illustrated, each having a name (corresponding to names 301A through 307A, respectively) and a value (corresponding to values 301B through 307B, respectively). Ellipses 208 represents that there may be more or less than 7 name-value pairs in any given message being processed. In one even more specific example, the collection of parameter name-value pairs may be hierarchically structured as in eXtensible Markup Language (XML) documents, in which each name-value pair represents a specific node in the XML hierarchy.

For discussion purposes only, the following specific XML example message is provided with line numbering added for clarity and ease of reference:

| | |
|---|---|
| 1. | <xsl:transform version=1.0" xmlns:xsl= 'http://www/w3/org/1999/XSL/Transform> |
| 2. | <xsl:template match="/"> |
| 3. | <s:Envelope xmlns:s="http://www.w3.org/2003/05/soap-envelope" xmlns: a="http://schemas.xmlsoap.org/ws/2004/08/addressing"> |
| 4. | <s:Header> |
| 5. | <a:Action s:mustUnderstand="1" wsu:Id="Action"> |
| 6. | http://schemas.xmlsoap.org/ws/2004/04/security/trust/RSTR/Issue |
| 7. | </a:Action> |
| 8. | <a:RelatesTo wsu:Id="RelatesTo"> |
| 9*. | Message1 |
| 10. | </a:RelatesTo> |
| 11. | <a:To s:mustUnderstand="1" wsu:Id="To"> |
| 12. | http://schemas.xmlsoap.org/ws/2004/08/addressing/role/anonymous |
| 13. | </a:To> |
| 14. | </s:Header> |
| 15. | <s:Body wsu:Id="Body"> |
| 16. | <wst:RequestSecurityTokenResponse> |
| 17. | <wst:TokenType>urn:oasis:names:tc:SAML:1.1</wst:TokenType> |
| 18. | <wst:Lifetime> |
| 19. | <wsu:Created> |
| 20*. | 30/11/2007 |
| 21. | </wsu:Created> |
| 22. | <wsu:Expires> |
| 23*. | 30/06/2008 |
| 24. | </wsu:Expires> |
| 25. | </wst:Lifetime> |
| 26. | <wst:RequestedSecurityToken> |
| 27*. | [binary target service x509 certificate] |
| 28. | </wst:RequestedSecurityToken> |
| 29. | <wst:RequestedAttachedReference> |
| 30*. | 12345678 |
| 31. | </wst:RequestedAttachedReference> |
| 32. | <wst:RequestedUnattachedReference> |
| 33*. | 12345678 |
| 34. | </wst:RequestedUnattachedReference> |
| 35. | </wst:RequestSecurityTokenResponse> |
| 36. | </s:Body> |
| 37. | </s:Envelope> |
| 38. | </xsl:template> |
| 39. | </xsl:tranform> |

In this example XML message, the precise content of the message is not important to a broader understanding. Perhaps the message processors 201 and 202 deal with this kind of message quite frequently, with only a few parameter values changed with each instance of the message. For instance, lines 9, 20, 23, 27, 30 and 33 are marked with an asterisk to symbolically represent that these values may change from one message to another. In FIG. 3, for example, perhaps values 302B and 305B change, but the rest tend to stay the same from one message of that type to another. Accordingly, values 302B and 305B are marked also with an asterisk.

Figure 4:
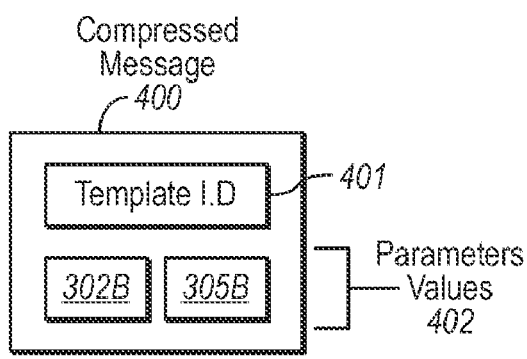
FIG. 4 illustrates a data structure of compressed message including a template identifier and one or more parameters.

FIG. 4 illustrates a data structure 400 of a compressed message. The compressed message 400 includes the parameter values 402 and a template identifier 401. The template identifier 401 includes enough information that corresponding template may be identified. In some cases, this might be an expressed identifier. However, in other cases, the template identification may be implicit.

An example of a template will be described with respect to FIG. 5. However, suffice it to say for now, that the template identified by the template identifier 401 may be used to provide semantic context for the parameters 402 within the context of the larger expanded message. In other words, the template defines a semantic framework for the values included in the message. For instance, the corresponding template may reflect much of the semantic context for the message 300, and indicate proper semantic context for the value 302B within the message 300 (i.e., that the value 302B corresponds to the parameter name 302A), and proper semantic context for the value 305B within the message (i.e., that the value 305B corresponds to the parameter name 305A). An example of this semantic context will be described with respect to FIG. 5.

Figure 5:
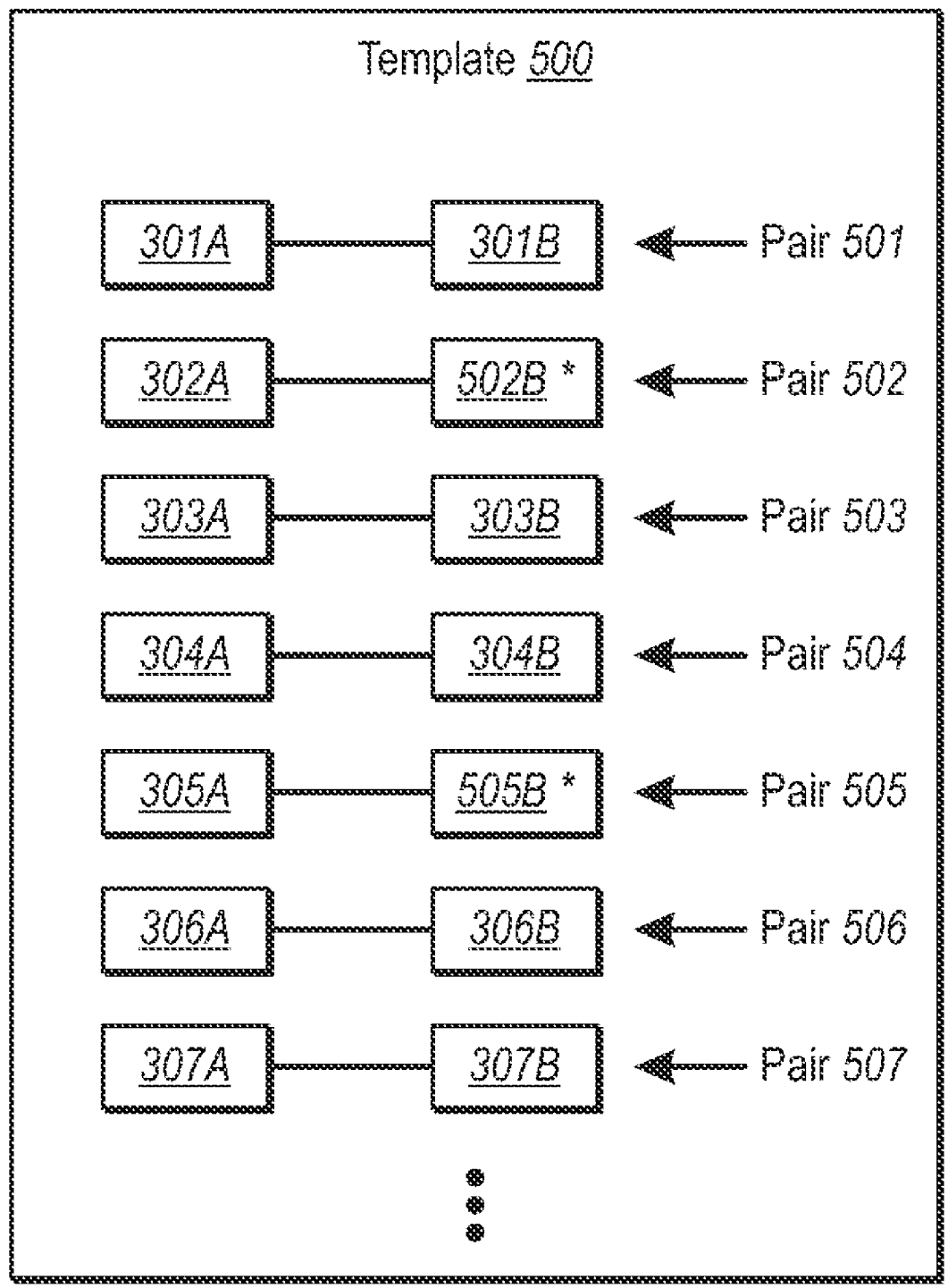
FIG. 5 schematically illustrates a data structure of a template that may be used to express the semantic context of the message, and the semantic context of the one or more parameters within the message.

FIG. 5 schematically illustrates a data structure of an example template 500 that corresponds to the message 300. The template 500 includes much of the semantic context for the message 300. For example, there are seven pairs of parameter name-values 501 through 507 in the template 500 that correspond to the seven parameter name-value pairs 301 through 307 of the expanded message 300. Furthermore, each of the parameters names of the pairs 501 through 507 of the template 500 are the same (i.e., names 301A through 307A) of the corresponding names of pairs 301 through 307 of the message 300. Also, in this example, some of the actual parameter values (values 301B, 303B, 304B, 306B and 307B) are the same in the template 500 and message 300. However, for those values in message 300 that are likely to change from one instance to another of that message type (i.e., values 302B and 305B of message 300), the template includes an abstract value (i.e., corresponding abstract values 502B and 505B). Such abstract values do not include an actual value for the parameter name, but are simply designated placeholders.

When compressing a message 300, the template 500 might be selected based on its close semantic similarity. The template 500 may then be used to compress the message 300. The compressed message 400 would identify (implicitly or expressly) the template 500, rather than include the entire template. The specific values of the message 300 that correspond to the abstract values of the template 500 would also be included in the compressed message 400. For instance, value 302B of message 300 corresponds to abstract placeholder value 502B of the template 500 and thus would be included in the compressed message 400. In one embodiment, the position of the value 302B within the compressed message correlates the value 302B to the abstract value 502B. Furthermore, value 305B of message 300 corresponds to abstract placeholder value 505B of the template 500 and thus would be included in the compressed message 400. The position of the value 302B within the compressed message correlates the value 302B to the abstract value 502B. Accordingly, when reconstructing the expanded message from the compressed message, the template 500 may be used to provide the semantic framework, with the actual parameter values replacing the corresponding abstract values of the template.

The following illustrates an example template with line numbering added for clarity. The example corresponds to the XML message example provided above.

| 1. | `<xsl:transform version="1.0" xmlns:xsl= 'http://www/w3/org/1999/XSL/Transform>` |
| --- | --- |
| 2. | `<xsl:template match="/">` |
| 3. | `<s:Envelope xmlns:s="http://www.w3.org/2003/05/soap-envelope" xmlns: a="http://schemas.xmlsoap.org/ws/2004/08/addressing">` |
| 4. | `<s:Header>` |
| 5. | `<a:Action s:mustUnderstand="1" wsu:Id="Action">` |
| 6. | `http://schemas.xmlsoap.org/ws/2004/04/security/trust/RSTR/Issue` |
| 7. | `</a:Action>` |
| 8. | `<a:RelatesTo wsu:Id="RelatesTo">` |
| 9*. | `<xsl:value-of select="$MessageId">` |
| 10. | `</a:RelatesTo>` |
| 11. | `<a:To s:mustUnderstand="1" wsu:Id="To">` |
| 12. | `http://schemas.xmlsoap.org/ws/2004/08/addressing/role/anonymous` |
| 13. | `</a:To>` |
| 14. | `</s:Header>` |
| 15. | `<s:Body wsu:Id="Body">` |
| 16. | `<wst:RequestSecurityTokenResponse>` |
| 17. | `<wst:TokenType>urn:oasis:names:tc:SAML:1.1</wst:TokenType>` |
| 18. | `<wst:Lifetime>` |
| 19. | `<wsu:Created>` |
| 20*. | `<xsl:value-of select="$Created">` |
| 21. | `</wsu:Created>` |
| 22. | `<wsu:Expires>` |
| 23*. | `<xsl:value-of select="$Expires">` |
| 24. | `</wsu:Expires>` |
| 25. | `</wst:Lifetime>` |
| 26. | `<wst:RequestedSecurityToken>` |
| 27*. | `<xsl:value-of select="$RequestedSecurityToken">` |
| 28. | `</wst:RequestedSecurityToken>` |
| 29. | `<wst:RequestedAttachedReference>` |
| 30*. | `<xsl:value-of select="$RequestedAttachedReference">` |
| 31. | `</wst:RequestedAttachedReference>` |
| 32. | `<wst:RequestedUnattachedReference>` |
| 33*. | `<xsl:value-of select="$RequestedUnattachedReference">` |
| 34. | `</wst:RequestedUnattachedReference>` |
| 35. | `</wst:RequestSecurityTokenResponse>` |
| 36. | `</s:Body>` |
| 37. | `</s:Envelope>` |
| 38. | `</xsl:template>` |
| 39. | `</xsl:tranform>` |

This example template appears very similar to the example message described above. In fact, in this example, the semantics of the message are preserved, with each line (lines 1-39) of the template being a replicate of each line (lines 1-39) of the message. The only exception to this in this example, are lines 9, 20, 23, 27, 30 and 33, which represent placeholders for actual values.

The following illustrates a specific example of compressed message that might result from the compression of the example 39 line message using the example 39 line template. Line numbering is added for clarity although the compressed message is simply a bit sequence with no concept of line numbering. The line numbering is only used to help explain the structure of the bit sequence.

| 1. | 0x0001 |
| --- | --- |
| 2. | 0x0032 |
| 3. | http://xml.schemas.org/2005/02/PSTS/constrainedRST |

-continued

| 4. | 0x00000008 |
| --- | --- |
| 5. | Message1 |
| 6. | 0x0000000A |
| 7. | 30/11/2007 |
| 8. | 0x0000000A |
| 9. | 30/06/2008 |
| 10. | 0x0000410a |
| 11. | [binary target service x509 certificate] |
| 12. | 0x00000008 |
| 13. | 12345678 |
| 14. | 0x00000008 |
| 15. | 12345678 |
| 16. | 0xFFFFFFFF |

Each line is represented using hexadecimal notation. The message begins at line 1 with 0x0001 in hexadecimal notation, which is the same as the bit sequence 0000000000000001. This indicates the beginning of the compressed message.

In this standard, the next information to appear will be the template identifier. However, to properly parse the template identifier from the message, line 2 includes a length of the template identifier (0x0032, which is 50 in base ten). Accordingly, after reading the bit sequence of line 2, the decompression component knows that the next 50 bytes will include a template identifier. By default, the decompression component may understand the template identifier will be expressed as a string with one byte per character in the string.

The decompression component then reads the next 50 bytes of data represented in line 3 to formulate the following string: "http://xml.schemas.org/2005/02/PSTS/constrainedRST".

This permits the decompression component to access the correct template for decompression. For instance, template 500 may be accessed to decompress message 400.

The decompression component will then expect to receive actual parameter values in the form of the length of the value, followed by the value itself. For example, Line 4 identifies the next parameter to be 8 bytes long. In particular, the parameter value is a string Message1. Line 6 identifies the next value to be 10 bytes long, and reads line 7 which is a string value for date 30/11/2007. Line 8 identifies the next value to be 10 bytes long, and reads line 9 which is a string value for date 30/06/2008. Line 10 identifies the next value to be 0x0000410a (expressed in hexadecimal) bytes long, and then reads the binary sequence symbolically represented by [binary target service x509 certificate] in line 11. Line 12 identifies the next value to be 8 bytes long and reads line 13 as value 12345678. Line 14 identifies the next value to be 8 bytes long and reads lines 15 as value 12345678. Line 16 includes hexadecimal sequence 0xFFFFFFFF, which indicates the end of the message. Optionally, if there were some optional values, the bit sequence 0xFFFFFFFE may be used instead, followed by one or more sequences of length-value pairs.

The extracted values may then be used, although with the template to reformulate the expanded message. For instance, "Message1" may be plugged in at line 9 of the template, "30/11/2007" may be plugged in at line 20, "30/06/2008" may be plugged in at line 23, [binary target service x509 certificate] may be plugged in at line 27, 12345678 may be plugged in at line 30, and 12345678 may be plugged in at line 33, to thereby reconstitute the larger message.

Figure 6:
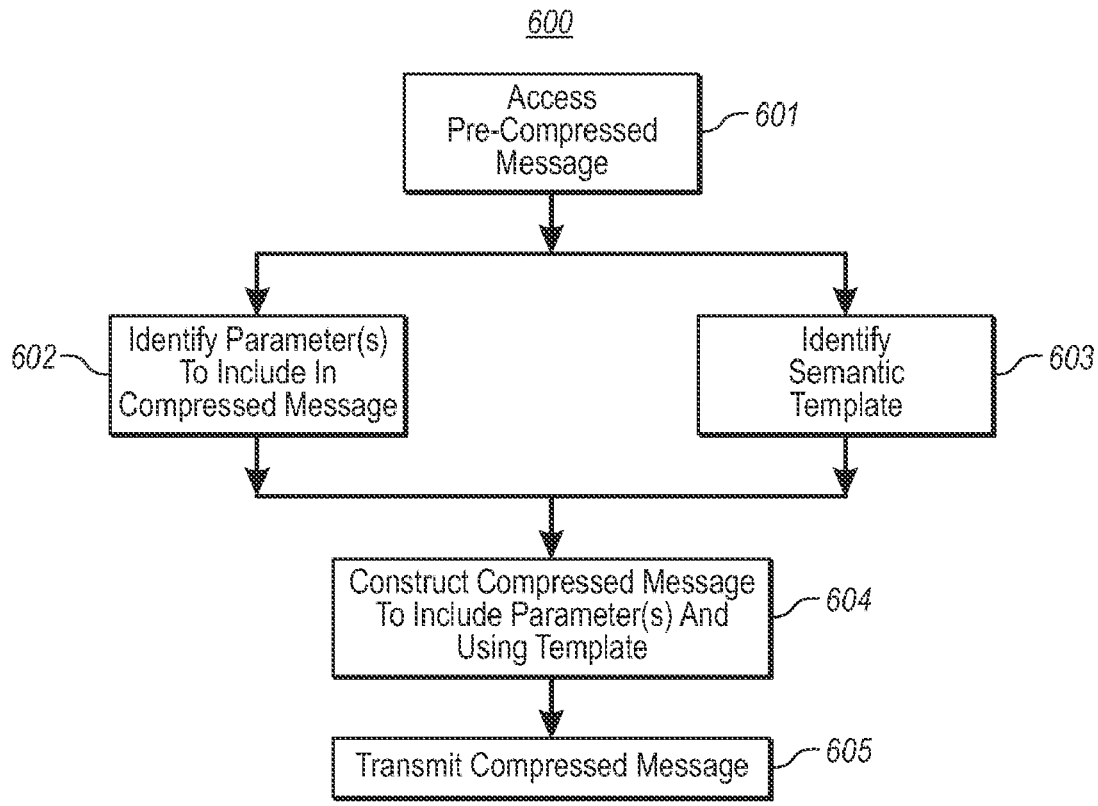
FIG. 6 illustrates a flowchart of a method for compressing the message using the template.

FIG. 6 illustrates a flowchart of a method 600 for compressing the compressed message. For instance, in FIG. 2A (and FIG. 2C), the transmit message processor 201A (and 201C)

compresses a message 212A (and 212C) to formulate compressed message 216A (and 216C).

The compression component first accesses a pre-compressed message (act 601). For instance, in FIG. 2A, the compression component 213A accesses the message 212A. In FIG. 2C, the compression component 213C accesses the message 212C.

The compression component also identifies one or more parameters to be included in the compressed message (act 602), and also identifies a template that corresponds to the message (act 603). The compression component may well use the template to identify which parameters of the message are to be included in the compressed message. In any case, the compressed message is then constructed in a manner that the template is at least implicitly identified (act 604). The compressed message may then be transmitted to the receive message processor (act 605).

Figure 7:
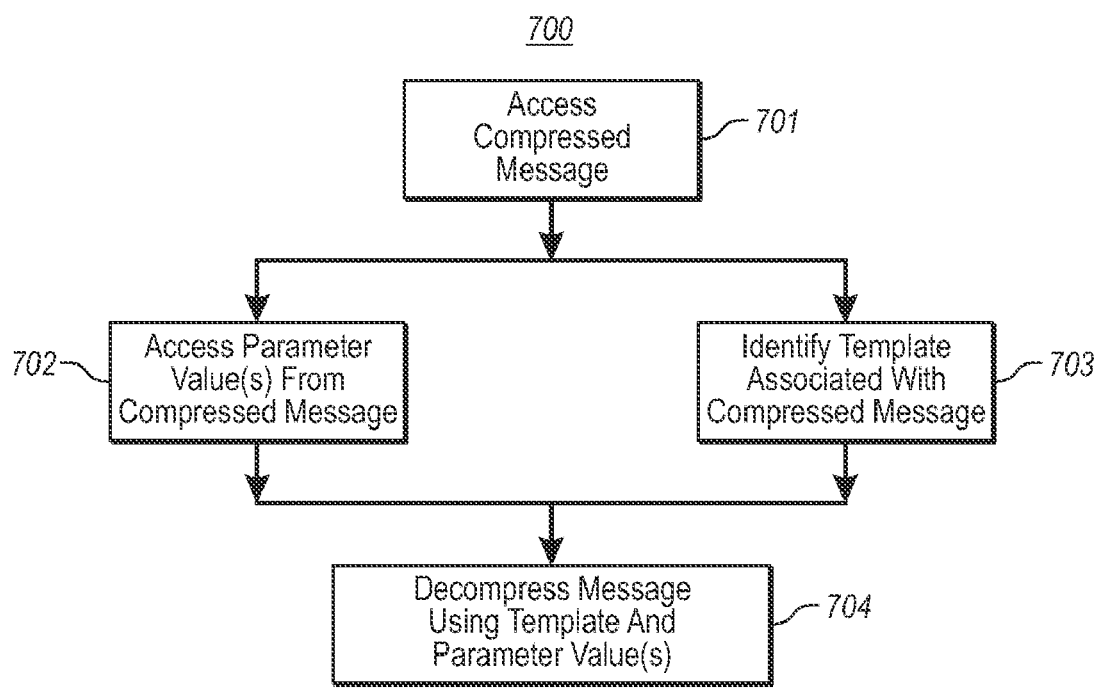
FIG. 7 illustrates a flowchart of a method for decompressing the message using the template.

FIG. 7 illustrates a flowchart of a method 700 for decompressing the compressed message. The receive message processor accesses the compressed message (act 701) by, for example, receiving at least a derivative of the compressed message from the transmit message processor. For instance, in FIGS. 2B (and 2C), the receive message processor 202B (and 202C) receives the compressed message 216B (act 216C).

The decompression component of the receive message processor then accesses the one or more parameter values from the compressed message (act 702), and also identifies a template associated with the compressed message (act 703). For instance, if the compressed message was structured as described for the compressed message 400 of FIG. 4, the decompression component may read the template identifier 401 from the compressed message 400, and may read the one or more parameter values 402 from the compressed message 400.

As previously mentioned, however, the template identifier may not be expressly included in the compressed message, but may perhaps be inferred. For example, there may be but a single template used when communicating between the two message processors, or perhaps there is a default template used when no other is specified.

The decompression component may then decompress or expand the compressed message into an expanded message (act 704) using the parameter values that were included within the compressed message, and using the identified template as previously described.

The semantic information described by the template may be understood by the transmit and receive message processors even well in advance of the first communication between the message processors. For instance, the compression and decompression may be included functionality of a distributed application, with different components installed on each message processor. In that case, each may understand the same template set implicitly based on the initial application installation. Alternatively, the template semantic information may be negotiated by the transmit and receive message processors within the same communication session as the message is communicated perhaps as an initial handshake operation. The template set may be static and unchanging. Alternatively or in addition, the template set may be altered dynamically as communication continues between the transmit and receive message processors.

Figure 8:
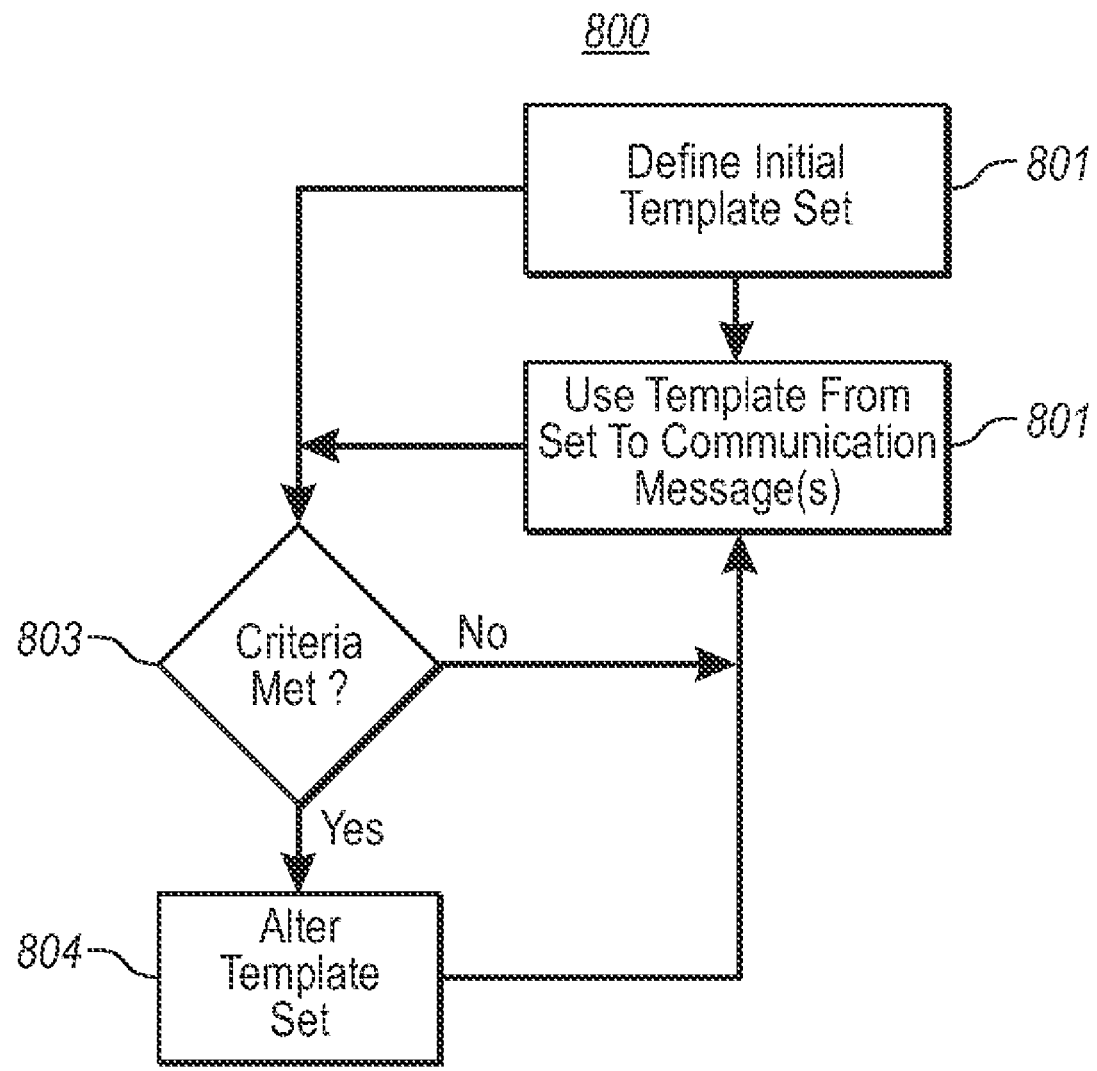
FIG. 8 illustrates a flowchart of a method for dynamically altering the template set.

FIG. 8 illustrates a flowchart of a method 800 for dynamically updating a template set used to communicate between two message processors. First, an initial semantic template set is identified for use in communicating between message processors (act 801). Then, for each of at least some messages communicated between the message processors, a particular template of the template set may be used to compress and/or decompress the message (act 802). In addition, one or more criteria may be defined for adding template set (decision block 803). If the one or more criteria are met (Yes in decision block 803), then the template set is altered (act 804). For example, perhaps if a message of a particular semantic structure is recognized as occurring with some frequency, a template may be created for such a semantic structure.

Accordingly, the embodiments described herein present an effective mechanism for compressing and/or decompressing messages using the semantic context for those messages. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method implemented by a computing system in a messaging environment that includes a transmit message processor and a receive message processor, wherein the method is a method for the transmit message processor to compress a message in preparation for transmission of the message to a receive message processor, the method comprising:

accessing a pre-compressed message;

identifying a template that corresponds to the message;

identifying one or more parameters of the pre-compressed message that are to be included in a compressed message corresponding to the pre-compressed message, wherein the identified template defines a semantic framework for the identified one or more parameters;

constructing the compressed message in a manner that the template is at least implicitly identified, and such that the compressed message includes values of the identified one or more parameters, the compressed message including:

a first bit sequence that identifies a beginning of the compressed message;

a second bit sequence that follows the first bit sequence and that defines a length of a template identifier corresponding to the template;

a character string that recites the template identifier and which is used to access the template for decompressing the compressed message;

at least one of the one or more parameters that are each provided in the form of a length of the one or more parameter followed by a corresponding parameter value; and a third bit sequence that identifies an end of the compressed message.

2. The method in accordance with claim 1, wherein the one or more parameters are a plurality of parameters of the pre-compressed message.

3. The method in accordance with claim 1, wherein the template represents a collection of parameter name-value field pairs, wherein a value field for at least one of the pairs includes a literal value, and wherein a value field for at least one of the pairs includes an abstract value.

4. The method in accordance with claim 3, wherein the message is represented by the template, but with the actual value for each of the one or more identified parameters replacing a corresponding abstract value of the template.

5. The method in accordance with claim 4, wherein the compressed message is constructed such that a correlation between the actual value for each of the one or more identified parameters and the corresponding abstract value of the template is represented based on a position of the actual value within the compressed message.

6. The method in accordance with claim 3, wherein the collection of parameter name-value fields are each expressed as nodes in a hierarchically structured data structure.

7. The method in accordance with claim 1, wherein the identified template is expressly identified in the compressed message.

8. The method in accordance with claim 1, further comprising:
transmitting the compressed message to the receiving message processor.

9. The method in accordance with claim 1, wherein the semantic information included in the template was understood by both the transmitting and receiving message processors prior to a same communication session between the transmitting and receiving message processors.

10. The method in accordance with claim 1, wherein the semantic information included in the template was negotiated by the transmitting and receiving message processors within the same communication session as the message is communicated.

11. The method in accordance with claim 1, wherein as communication continues between the transmitting and receiving message processors, the template set dynamically changes.

12. A method implemented by a computing system in a messaging environment that includes a transmit message processor and a receive message processor, wherein the method is a method for the receive message processor to decompress a message received from the transmit message processor, the method comprising:
accessing a compressed message, the compressed message including:
  a first bit sequence that identifies a beginning of the compressed message;
  a second bit sequence that follows the first bit sequence and that defines a length of a template identifier corresponding to the template;
  a character string that recites the template identifier and which is used to access the template for decompressing the compressed message;
  at least one of the one or more parameters that are each provided in the form of a length of the one or more parameter followed by a corresponding parameter value; and
  a third bit sequence that identifies an end of the compressed message;
identifying a template that corresponds to the compressed message from the character string, wherein the template defines a semantic framework for the identified one or more parameters within a decompressed message that corresponds to the compressed message;
accessing the value for each of the one or more parameters from the compressed message; and
decompressing the compressed message to generate the corresponding decompressed message using the identified template and the value of each of the one or more parameters accessed from the compressed message.

13. The method in accordance with claim 12, wherein accessing the compressed message comprises receiving at least a derivative of the compressed message from the transmitting message processor.

14. The method in accordance with claim 12, wherein decompressing the compressed message to generate the corresponding decompressed message using the identified template and the values of the one or more parameters accessed from the compressed message comprises the following:
for each value, determining a position of the value within the template using a position of the value within the compressed message.

15. The method in accordance with claim 12, wherein identifying a template that corresponds to the compressed message comprises:
using a template identifier within the compressed message to identify the template.

16. The method in accordance with claim 12, wherein identifying a template that corresponds to the compressed message comprises:
identifying a default template as the template.

17. The method in accordance with claim 16, wherein identifying a template further comprising the following before identifying a default template:
determining that there is no template identifier in the compressed message.

18. The method in accordance with claim 12, wherein identifying a template includes using at least information within the compressed message to formulate a new template.

19. One or more computer-readable storage media having stored thereon computer-executable instructions that, when executed by one or more processors, specifies a protocol for transmitting messages from a transmitting message processor to a receiving message processor, the protocol comprising:
identify an initial template set for use in communicating messages between the message processors, wherein each template provides semantic context for message of common semantics;
for each of at least some messages communicated between the message processors, identify a template of the template set to use in compressing a compressed message or decompressing the compressed message, the compressed message including:
  a first bit sequence that identifies a beginning of the compressed message;
  a second bit sequence that follows the first bit sequence and that defines a length of a template identifier corresponding to the template;
  a character string that recites the template identifier and which is used to access the template for decompressing the compressed message;
  at least one of the one or more parameters that are each provided in the form of a length of the one or more parameter followed by a corresponding parameter value; and
  a third bit sequence that identifies an end of the compressed message;
define one or more criteria for adding templates to the template set; and
upon determining that one or more criteria are met, altering the template set.

* * * * *